US006914761B2

(12) United States Patent
Gambino et al.

(10) Patent No.: US 6,914,761 B2
(45) Date of Patent: Jul. 5, 2005

(54) MAGNETORESISTIVE SENSOR WITH MAGNETIC FLUX PATHS SURROUNDING NON-MAGNETIC REGIONS OF FERROMAGNETIC MATERIAL LAYER

(75) Inventors: Richard Joseph Gambino, Stony Brook, NY (US); Thomas Penney, III, South Salem, NY (US); John Casimir Slonczewski, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/827,080

(22) Filed: Apr. 19, 2004

(65) Prior Publication Data

US 2004/0196595 A1 Oct. 7, 2004

Related U.S. Application Data

(62) Division of application No. 10/193,497, filed on Jul. 11, 2002, now Pat. No. 6,775,109, which is a division of application No. 08/414,865, filed on Mar. 31, 1995, now Pat. No. 6,510,031.

(51) Int. Cl.$^7$ ............................................. G11B 5/39
(52) U.S. Cl. .................................................. 360/326
(58) Field of Search ................................. 360/326, 324

(56) References Cited

U.S. PATENT DOCUMENTS

| 3,256,483 A | 6/1966 | Broadbent | 324/65 |
|---|---|---|---|
| 3,879,760 A | 4/1975 | Lazzari | 360/113 |
| 3,887,944 A | 6/1975 | Bajorek et al. | 360/113 |
| 4,686,472 A | 8/1987 | Van Ooijen et al. | 324/252 |
| 4,987,094 A | 1/1991 | Colas et al. | 437/81 |
| 5,038,131 A | 8/1991 | Olk et al. | 338/32 R |
| 5,084,794 A | 1/1992 | Smith | 360/113 |
| 5,085,935 A | 2/1992 | Mallary | 428/336 |
| 5,119,025 A | 6/1992 | Smith et al. | 324/252 |
| 5,134,533 A | 7/1992 | Friedrich et al. | 360/113 |
| 5,155,643 A | 10/1992 | Jones, Jr. et al. | 360/113 |
| 5,159,513 A | 10/1992 | Dieny et al. | 360/113 |
| 5,452,163 A * | 9/1995 | Coffey et al. | 360/324 |

FOREIGN PATENT DOCUMENTS

| JP | 04-1907 | 1/1992 | G11B/5/39 |
|---|---|---|---|
| JP | 04-26160 | 1/1992 | H01L/29/06 |

OTHER PUBLICATIONS

S. S. P. Parkin et al., "Oscillations in Exchange Coupling and Magnetoresistance in Metallic Superlattice Structures: Co/Ru, Co/Cr, and Fe/Cr", Ph. Rev. Let., vol. 64, No. 19, pp. 2304–2307, May 7, 1990.

W. P. Pratt, Jr. et al., "Perpendicular Giant Magnetoresistances of Ag/Co Multilayers", Ph. Rev. Let., vol. 66, No. 23, pp. 3060–3063, Jun. 10, 1991.

J. Q. Xiao et al., "Giant Magnetoresistance in Nonmultilayer Magnetic Systems", Ph. Rev. Let., vol. 68, No. 25, pp. 3749–3752, Jun. 22, 1992.

B. Voigtländer et al., "Epitaxial growth of Fe on Au (111) : a scanning tunneling microscopy investigation", Surface Science Letters, vol. 255, (1991), pp. L529–L535.

(Continued)

Primary Examiner—Craig A. Renner
(74) Attorney, Agent, or Firm—Robert M. Trepp; Alek P. Szecsy (57) ABSTRACT

A magnetoresistive sensor includes a substrate and a layer of ferromagnetic material formed over the substrate. A plurality of nonmagnetic regions is formed within the layer of ferromagnetic material. Magnetic flux paths form around each one of the plurality of nonmagnetic regions when the layers of ferromagnetic material is not in a magnetic field. The flux paths are contained completely with the layer of ferromagnetic material and do not penetrate into the plurality of nonmagnetic regions. The sensor also provides for detecting a change in resistance through the layer of ferromagnetic material as a function of a magnetic field applied to the layer of ferromagnetic material.

4 Claims, 5 Drawing Sheets

OTHER PUBLICATIONS

J. A. Stroscio et al., "Microscopic aspects of the initial growth of the metastable fcc iron on Au (111)", J. Vac. Sci. Technol. A 10 (4), Jul./Aug. 1992, pp. 1981–1985.

W. W. Chow et al., "Aspect Ratio of Magnetoresistive Detector Stripes", IBM Technical Disclosure Bulletin, vol. 24, No. 3, p. 1481, Aug. 1981.

K. Y. Ahn, "Bubble Device Fabrication", IBM Technical Disclosure Bulletin, vol. 18, No. 12, May 1976, p. 4204.

K. Y. Ahn et al., "Fabrication of Bubble Domain Contiguous Disk Devices", IBM Technical Disclosure Bulletin, vol. 22, No. 7, Dec. 1979, pp. 2991–2992.

* cited by examiner

MAGNETORESISTIVE SENSOR WITH MAGNETIC FLUX PATHS SURROUNDING NON-MAGNETIC REGIONS OF FERROMAGNETIC MATERIAL LAYER

CROSS-REFERENCE TO RELATED APPLICATIONS

This application is a divisional application of application Ser. No. 10/193,497, filed 11 Jul. 2002 now U.S. Pat. No. 6,775,109, which in turn is a divisional application of application Ser. No. 08/414,865, filed 31 Mar. 1995, now U.S. Pat. No. 6,510,031, issued 21 Jan. 2003.

FIELD OF THE INVENTION

This invention relates to magnetoresistive sensors and more particularly to giant magnetoresistive effect (GMR) sensors using controlled magnetostatic coupling to obtain opposite alignment of magnetic regions of soft magnetic materials.

BACKGROUND OF THE INVENTION

The giant magnetoresistive effect (GMR) depends on having magnetic regions which are not aligned with respect to each other in a zero amplitude magnetic field. When the magnetic regions are at saturation in a magnetic field, the magnetization in the magnetic regions are fully aligned. The GMR of magnetic regions in magnetic saturation is defined as the change in resistance from zero magnetic field to the resistance at magnetic saturation normalized by the zero field resistance.

Giant magnetoresistance has been discovered in magnetic multilayers. In a publication by S. S. P. Parkin et al., Phys. Rev. Lett. 64, 2304 (1990), the magnetoresistance in metallic superlattice structures of Co/Ru, Co/Cr, and Fe/Cr was reported. Values of $\Delta R/R$ of up to 33 percent have been observed in a Fe/Cr superlattice structure. This can be compared to $\Delta R/R$ of a few percent for the anisotropic magnetoresistance of a simple permalloy thin film sensor.

In a publication by W. P. Pratt et al., Phys. Rev. Lett. 66, 3060 (1991), in magnetic multilayers of Ag/Co, the magnetoresistance with the current flow perpendicular to the layer has the largest change of resistance, for example, near 50 percent as compared to the magnetoresistance of current in the plane of the layer which may have a $\Delta R/R$ of 12 percent. Also, in multilayer structures, the magnetic fields required to obtain the large values of $\Delta R/R$ are very large because the magnetic field must be sufficient to overcome the antiferromagnetic exchange between the layers. These magnetic fields are much larger than the fringing field of a magnetic transition on a disk or tape representing stored data.

In exchange coupled films, the magnetic field required to align the oppositely magnetized regions depends on the strength of the antiferromagnetic exchange between the layers. The magnetic field required to align the oppositely magnetized regions tend to be very large, for example, on the order of 10 kOe.

A spin valve is a sandwich structure of two magnetic layers with a nonmagnetic layer between such as described in U.S. Pat. No. 5,159,513 which issued on Oct. 27, 1992 to B. Dieny et al. In a spin valve, one magnetic layer has its magnetic orientation fixed, usually by exchanged coupling. The other magnetic layer is free to switch in the applied field except for its own coercivity (Hc) hysteresis. The resistance of the device is highest when the magnetic fields are oppositely aligned or aligned perpendicularly and the lowest resistance is when the magnetic fields are aligned. The magnitude of the giant magnetoresistive effect in spin valve structures may be seven to nine percent as shown in U.S. Pat. No. 5,159,513 which is not as high as in multilayer structures.

The giant magnetoresistive effect has also been reported in granular thin films in a publication by J. Q. Xiao et al., Phys. Rev. Lett. 68, 3749 (1992). These granular thin films consist of small phase separated single domain magnetic particles, for example, Co in Cu, a nonmagnetic conductive matrix. So far, the giant magnetoresistive effect has only been observed in a limited set of materials which phase separate into suitable magnetic and nonmagnetic regions. The magnetization is oriented along the easy axis of each particle which varies randomly from particle to particle. The magnetic field must overcome the magnetocrystalline anisotropy and the shape anisotropy of the Co particles. In addition, if there is any interfacial strain at the Cu/Co interface, there may be an additional anisotropy through the magnetostriction ($\lambda$). The magnetic field necessary to overcome the random directions by local anisotropy is on the order of 10 kOe. Also, $\Delta R/R$ is smaller than in multilayer structures, probably because the change in alignment is less extreme, being from random to parallel rather than from perpendicular to parallel or antiparallel to parallel.

SUMMARY OF THE INVENTION

In accordance with the present invention, an apparatus for sensing a magnetic field by the giant magnetoresistive effect (GMR) is described comprising a plurality of magnetic stripes spaced apart on the upper surface of a substrate such that the stray fields at the ends of the magnetic stripes provide a magnetostatic coupling which magnetizes the magnetic stripes in alternating directions in a zero magnetic field, a nonmagnetic conductive material such as copper, positioned in the spaces between the magnetic stripes to form a conductive path between respective stripes, and terminals or electrodes for introducing a current along the conductive path for detecting the change in resistance through the plurality of stripes and conductive paths as a function of magnetic fields applied to the magnetic stripes. The magnetic stripes may be rectangular in shape and spaced apart from one another by at least a 100 Å to prevent any exchange coupling. The magnetic stripes may comprise a soft magnetic material. The magnetostatic coupling between ends of magnetic stripes may be enhanced by positioning transverse magnetic stripes over or abutted to the ends which function as permeable "keepers". The cross-sectional areas of the magnetic stripes may be less than 1000 Å square. The apparatus is suitable for incorporation in a head for sensing a magnetic disk in a magnetic disk operating system. When the magnetic stripes are magnetized in alternating directions, a high resistance state is measured to current passing through the plurality of magnetic stripes and when a magnetic field causes the magnetic stripes adjacent one another to be magnetized in the same direction, a low resistance state is measured to current passing through the plurality of magnetic stripes.

The invention further provides, a method for fabricating a magnetic head comprising the steps of orienting, cutting and polishing or selecting a single crystal substrate having a surface at an angle between 1 and 10° away from a major crystallographic plane, annealing the crystal to produce atomic scale steps on its surface, depositing a ferromagnetic metal such as Fe, Co, or Ni or alloys thereof onto the single crystal substrate surface, overcoating the ferromagnetic metal with a nonmagnetic metal of comparable thickness and planarizing the nonmagnetic metal to form alternating regions of magnetic and nonmagnetic metals on the surface of the substrate.

The invention provides a plurality of magnetic stripes of soft magnetic material spaced apart for controlled magnetostatic coupling therebetween to obtain opposite alignment of the magnetization of adjacent stripes in zero magnetic field.

The invention further provides an apparatus for sensing a magnetic field wherein the magnetic field required for magnetic saturation depends on the magnetostatic coupling which can be controlled by way of the geometry of the magnetic stripes and their spacing.

The invention further provides an apparatus for sensing a magnetic field wherein the magnetic stripes are made of soft magnetic materials such as iron, nickel or alloys thereof having high permeability, low coercive force and small hysteresis loss so that the anisotropy magnetic fields are small and do not dominate the magnetic saturation field as in granular films. The distance between the magnetic regions or between magnetic stripes is large enough such as 100 Å such that the magnetic stripes are not strongly exchanged coupled to the adjacent magnetic stripe respectively.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENT

Figure 1:
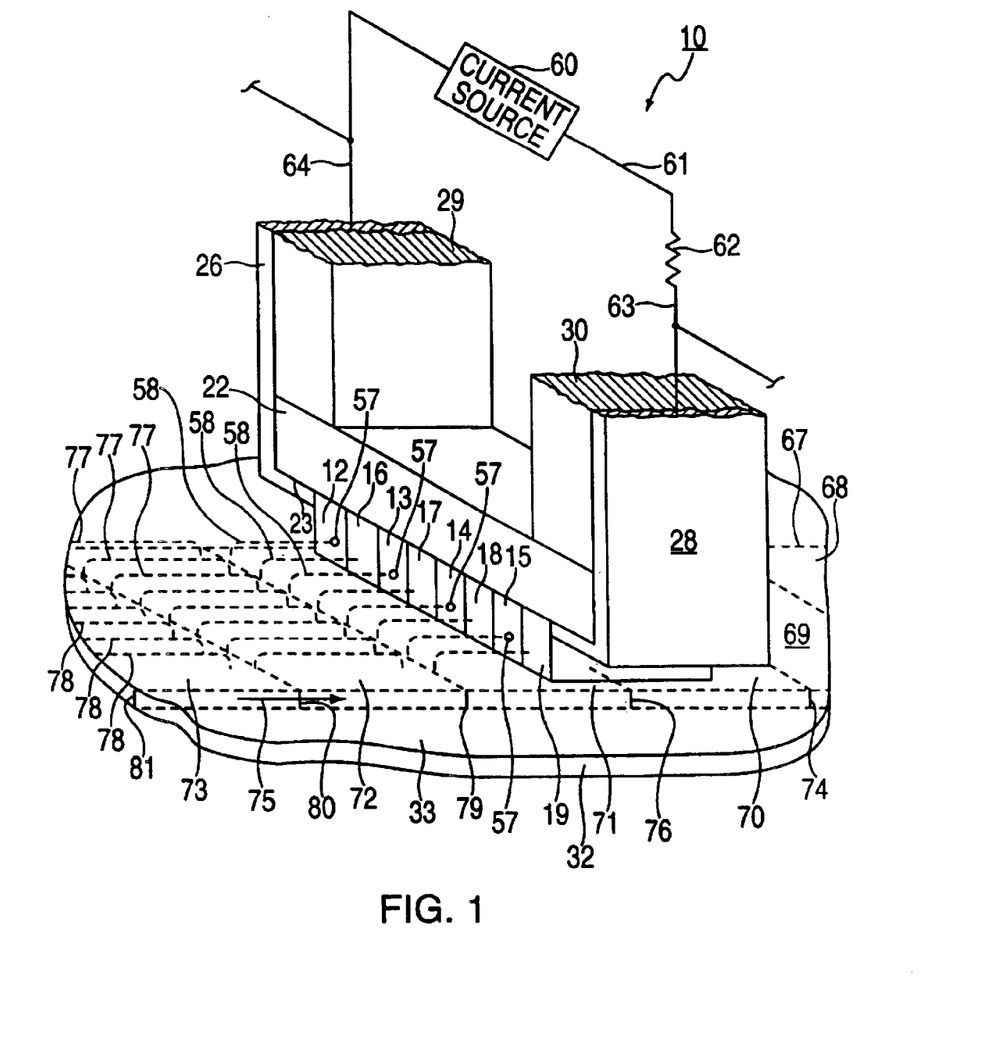
FIG. 1 is a first perspective view of a first embodiment of the invention.
Figure 2:
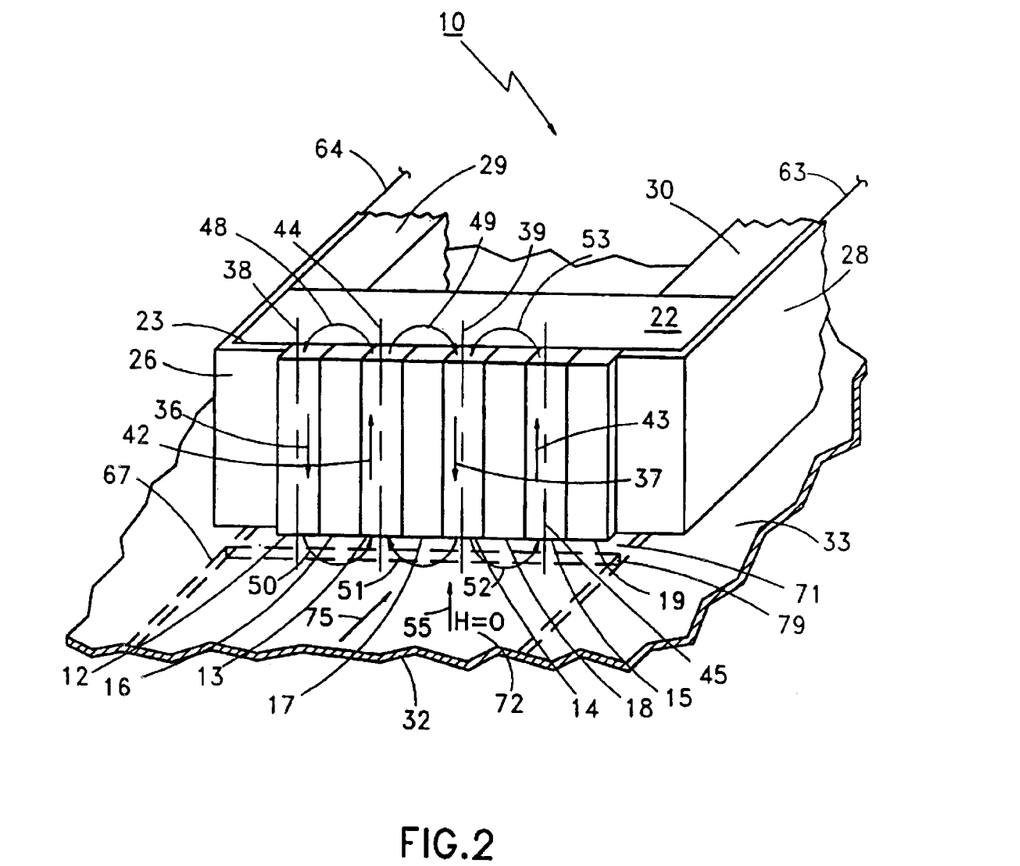
FIG. 2 is a second perspective view of the first embodiment of the invention.

Referring to FIGS. 1 and 2, a magnetic head 10 for sensing a magnetic field is shown. A plurality of magnetic stripes 12 through 15 are spaced apart such as by nonmagnetic conducting stripes 16 through 19. Magnetic stripes 12 through 15 and nonmagnetic stripes 16 through 19 are positioned adjacent one another, side by side, in electrical contact to one another on substrate 22. Substrate 22 may be nonmagnetic and nonmetallic such as ceramic, glass, sapphire, quartz, magnesium oxide, semi-insulating such as silicon, silicon germanium, gallium arsenide, silicon-on-insulator or a polymer. Substrate 22 has a lower surface 23 upon which magnetic stripes 12 through 15 and nonmagnetic conductive stripes 16 through 19 are positioned. Magnetic stripe 12 is electrically coupled to electrode 26 which may, for example, extend along surface 23 and wrap around the end of substrate 22. Nonmagnetic conductive stripe 19 is coupled to electrode 28 which may for example extend along surface 23 and wrap around the end of substrate 22 at the end opposite electrode 26. Substrate 22 and electrode 26 may be supported by arm 29. Electrode 28 and substrate 22 may be supported by arm 30. Arms 29 and 30 function to position magnetic head 10 with respect to magnetic media 32 having an upper surface 33 as shown in FIG. 1 such as transverse or 90° to magnetic media 32 as shown in FIG. 2. Magnetic media 32 may be for example a magnetic disk having a layer of magnetic material thereon suitable for storing information. Arms 29 and 30 may be rigid and in a fixed relationship to one another.

Magnetic stripes 12 through 15 may be made of soft magnetic material such as iron, nickel or alloys thereof having high permeability, low coercive force and small hysteresis loss so that anisotropy fields are small and do not dominate the saturation field of the respective magnetic stripe. The ends of magnetic stripes 12 through 15 are positioned with respect to one another to foster magnetostatic coupling between respective ends of magnetic stripes resulting in odd or even magnetic stripes 12 through 15 being magnetized in opposite directions to respective even or odd magnetic stripes as shown in FIG. 2. For example, magnetic stripes 12 and 14 are magnetized in a first direction shown by arrows 36 and 37 which are parallel and correspond the longitudinal axes 38 and 39 respectively. Magnetic stripes 13 and 15 are magnetized in a second direction opposite to the first direction shown by arrows 42 and 43 which are parallel to the longitudinal axes 44 and 45 respectively.

The magnetostatic coupling from a first end of magnetic stripe 13 is shown by arrows 48 and 49. Arrow 48 represents the magnetostatic coupling to a first end of magnetic stripe 12 and arrow 49 represents the magnetostatic coupling to a first end of magnetic stripe 14. Arrow 50 represents the magnetostatic coupling from a second end of magnetic stripe 12 to a second end of magnetic stripe 13. Arrow 51 represent the magnetostatic coupling from a second end of magnetic stripe 14 to a second end of magnetic stripe 13. Arrow 52 represents the magnetostatic coupling from a second end of magnetic stripe 14 to a second end of magnetic stripe 15. Arrow 53 represents the magnetostatic coupling from a first end of magnetic stripe 15 to a first end of magnetic stripe 14. Each magnetic stripe may have about equal magnetostatic coupling such as shown by arrows 48 and 49 to the adjacent magnetic stripes 12 and 14. The number of magnetic stripes may be in the range from 2 to about 10,000. The magnetic stripes 12 through 15 are separated from one another by a distance such as 100 Å which is large enough so that they are not strongly antiferromagnetic exchanged coupled. The external magnetic field with the magnetostatic coupling as shown in FIG. 2 corresponds to an applied magnetic field H of zero shown by arrow 55. With opposite magnetic alignment of adjacent magnetic stripes 12 through 15, magnetic head 10 is in a high electrical resistant state between electrodes 26 and 28.

FIG. 1 shows the low electrical resistant state of magnetic head 10 where magnetic stripes 12 through 15 are magnetized in the same direction as shown by arrows 57 in the presence of an applied magnetic field H shown by dashed arrows 58. The low and high electrical resistance state of magnetic head 10 may be detected by passing an electrical current through the plurality of magnetic stripes and plurality of nonmagnetic conductors by way of electrodes 26 and 28. Current source 60 provides current over leads 61, through resistor 62 and over lead 63 to electrode 28. Current from electrode 26 is coupled over lead 64 back to current source 60. The voltage across leads 63 and 64 provide an indication of the resistance of magnetic head 10.

Referring to FIG. 1, in operation magnetic media 32 may have information stored therein in track 67 in the form of magnetic domains 68 through 73, with magnetic domain walls 74, 76, and 79–81 there between. As magnetic media is moved as shown by arrow 75, magnetic domains 68 through 73 pass underneath magnetic head 10 and in close proximity to magnetic stripes 12 through 15. As magnetic domain 71 passes under magnetic head 10, fringe magnetic fields shown by arrows 58 are aligned in the same longitudinal direction as magnetic stripes 12 through 15 and magnetically saturate magnetic stripes 12 through 15 in the longitudinal direction as shown by arrows 57. The resistance of the current passing through magnetic stripes 12 through 15 from electrode 28 to electrode 26 or vice-versa will be low due to the giant magnetoresistive effect (GMR). As magnetic domain 72 passes underneath magnetic head 10, the fringe magnetic field shown by arrows 77 will cause magnetic stripes 12 through 15 to magnetically saturate in the opposite direction. As magnetic stripes 12 through 15 change direction in magnetization, the magnetoresistance state will be high due to the misalignment of the magnetization due to the partial change of magnetic direction experience as magnetic domain 72 moves underneath magnetic head 10. When magnetic domain 72 is completely underneath magnetic head 10, fringe magnetic fields shown by arrows 77 are aligned with the longitudinal direction of magnetic stripes 12 through 15 and magnetically saturate magnetic stripes 12 through 15 in the longitudinal direction opposite to that shown by arrows 57. The electrical resistance through magnetic head 10 via electrodes 26 and 28 will be low due to the giant magnetoresistive effect (GMR). Arrows 78 show the direction of fringe magnetic fields for magnetic domain 73 which may be in the same direction as magnetic domain 72. When magnetic head 10 moves from being over magnetic domain 72 to being over magnetic domain 73, the electrical resistance through magnetic head 10 via electrodes 26 and 28 will remain low as magnetic stripes 12 through 15 will remain magnetically saturated in the same direction as when magnetic head was over magnetic domain 72.

The magnetic field to be sensed such as shown by arrows 58 in FIG. 1, may be applied in the plane of the device i.e., parallel to surface 23 of which magnetic stripes 12 through 15 are positioned and through magnetic stripes 12 through 15. The electrical resistance between electrodes 26 and 28 will decrease until magnetic stripes 12 through 15 are saturated in the direction of the applied magnetic field which may be 30 Oe or less as shown by arrows 58 with respect to magnetic domain 70 which is the low GMR state.

Referring to FIG. 2, magnetic head 10 is positioned so that the magnetic stripes 12–15 are aligned transverse to surface 33 of magnetic media 32 to intercept transverse fringe magnetic fields shown in FIG. 1 from magnetic domains 71 and 72 at or near domain wall 79. Magnetic media 32 and more particularly track 67 is moving underneath magnetic head 10. The vertical or transverse (vertical) component of the magnetic domain shown by arrows 58 and 77 in FIG. 1 cause magnetic stripes 12–15 to be magnetically aligned in parallel lowering the resistance of magnetic head 10. For example, when the magnetic stripes 12–15 are approaching domain wall 79 but are still in the region of magnetic domain 71 where the fringe fields, shown by arrows 58 in FIG. 1, are parallel to surface 33, the magnetic stripes will be alternately magnetized due to magnetostatic coupling from adjacent magnetic stripes. When the fringe magnetic fields become vertical or transverse upon approaching the end of magnetic domain 71 near domain wall 79 as shown by arrows 58 in FIG. 1, the magnetization of magnetic stripes 12–15 will be directed in the down direction as shown by arrow 36. Magnetic head 10 will be in the low resistance state with the magnetization of magnetic stripes 12–15 aligned parallel.

As media 32 moves domain wall 79 past magnetic stripes 12–15, the magnetic stripes will be magnetized in the down direction near domain wall 79. As media 32 moves domain wall 79 way past magnetic stripes 12–15, the fringing magnetic fields of domain 72 will be parallel to surface 33 and there will be no vertical or transverse magnetic component to magnetize magnetic stripes 12–15. Magnetic head 10 will be in the high resistance state.

Figure 3:
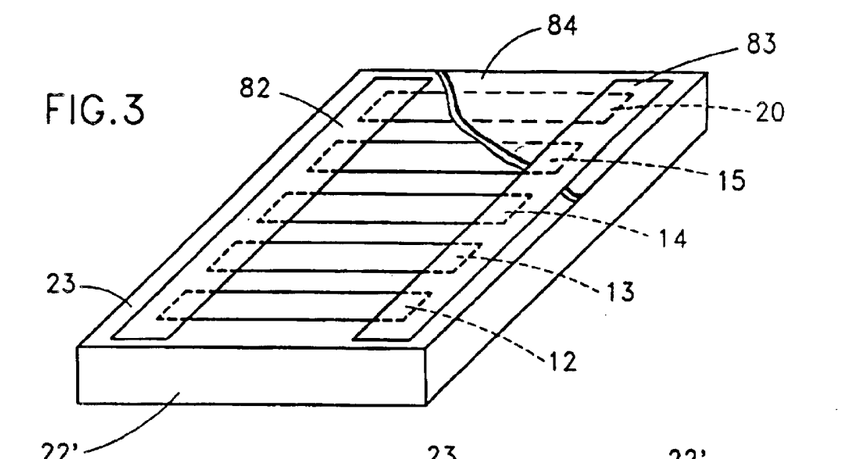
FIG. 3 is a perspective view of a second embodiment of the invention.

FIG. 3 shows an alternate embodiment of the invention where in addition to the plurality of magnetic stripes 12 through 15 and nonmagnetic conducting stripes 16 through 19 on substrate 22', there are magnetic keepers 82 and 83 positioned over the ends of the magnetic stripes 12 through 15 as shown in FIG. 3. In FIG. 3 like references are used for functions corresponding to the apparatus of FIGS. 1 and 2. Keepers 82 and 83 function to strengthen or reinforce the magnetostatic coupling connecting the ends of stripes 12 through 15.

For optimal performance, a nonmagnetic electrically insulating spacer 84 must separate magnetoresistive stripes 12–15, together with the intervening nonmagnetic conductors 16–19, from the two keepers 82 and 83. Spacer 84 serves to (1) prevent exchange stiffness coupling which would tend to align the stripe magnetizations in the same direction, thus counteracting the beneficial keeper effect, and (2 prevent the keepers, if conducting, from short circuiting magnetoresistive stripes 12–15. Spacer 84 thickness may be in the range from about 50 Å to about 200 Å and is optimally about 100 Å in thickness and needs no lithography since it can blanket over magnetic stripes 12–15 and nonmagnetic conductive stripes 16–19.

Figure 4:
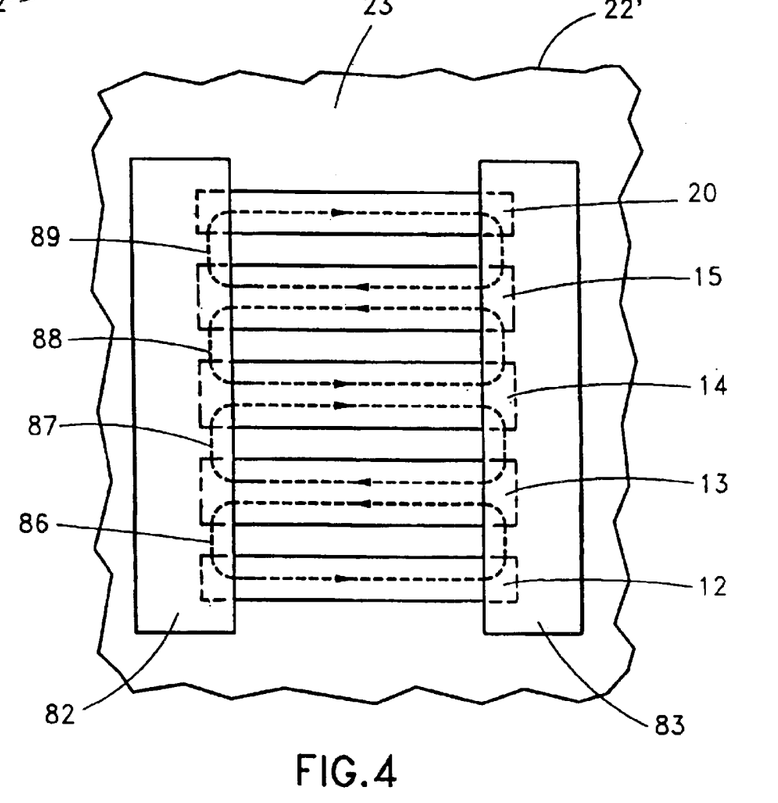
FIG. 4 is a first top view of FIG. 3.

FIG. 4 is a first top view of FIG. 3 showing the magnetic fields and magnetic stripes 12 through 15, non magnetic stripes 16–19 and keepers 82 and 83. The magnetic flux carried by each magnetic stripe 12 through 15 respectively is divided in two parts at its ends, each part closing through one of the neighboring magnetic stripes. Therefore, the saturation or magnetic flux capacity of each keeper 82 and 83 should be one half of the saturated magnetic flux capacity of stripes 12 through 15 respectively. In FIG. 4, flux paths 86 and 87 are shown passing through magnetic stripe 13 with flux path 86 passing through magnetic stripe 12 and flux path 87 passing through magnetic stripe 14. Flux paths 87 and 88 pass through magnetic stripe 14 in the opposite direction of flux paths 87 and 86 passing through magnetic stripe 13. Flux path 88 passes through magnetic stripe 15.

Magnetic stripe 15 has flux paths 88 and 89 passing through it in opposite direction as flux paths 88 and 87 in magnetic stripe 14. Flux path 89 also passes through magnetic stripe 20.

Figure 5:
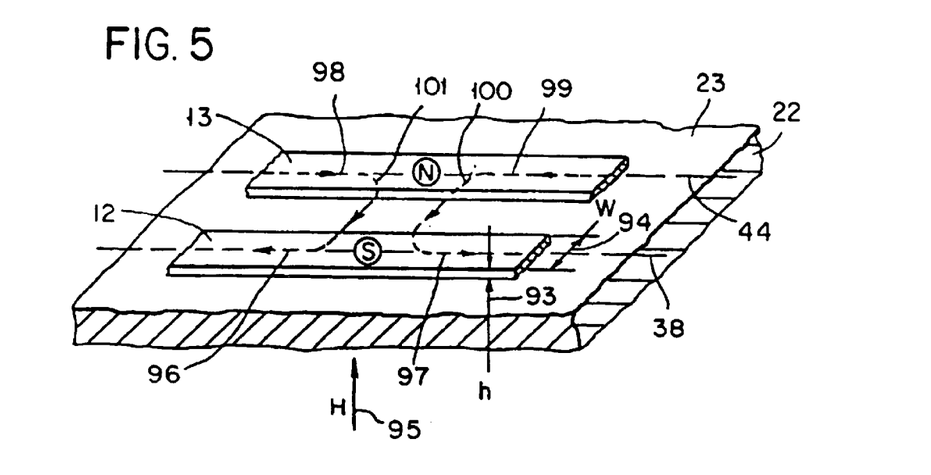
FIG. 5 is a second top view of FIG. 3.

Referring to FIG. 5, a magnetic field may be applied perpendicular to the longitudinal axis of the magnetic stripe such as perpendicular to axes 38 and 44 of magnetic stripes 12 and 13 shown on FIG. 5. An applied magnetic field H shown by arrow 95 perpendicular to the longitudinal axis will produce parallel alignment of the magnetization within magnetic stripes 12 and 13 when the demagnetization field of the magnetic stripe is overcome. The demagnetizing field B is shown in equation 1.

$$4\pi M = 4\pi M_s h/(w+h) \tag{1}$$

In equation 1, h as shown in FIG. 5 by arrow 93 is equal to the height of the magnetic stripe and W as shown in FIG.

5 by arrow 94 is equal to the width of the magnetic stripe. The term $M_s$ is the saturation magnetization. One advantage of applying a magnetic field H perpendicular to the longitudinal axis of the magnetic stripe is that the magnetic transition within the material is by rotation and therefore faster, more nearly linear, and free of hysteresis. The magnetic field B in a magnetic stripe such as magnetic stripe 12 shown on FIG. 5 is given in equation 2 where H shown by arrow 95 is the applied field and 4 nM is a demagnetization field.

$$B=H+4\pi M \qquad (2)$$

As shown in FIG. 5, for sufficiently small magnetic stripes with cross sections, less than 1000 square angstroms, domain walls will nucleate thermally. Then the magnetic response will not have a threshold, and hysteresis will be absent. In this regime, the permeable keepers 82 and 83 shown in FIG. 4 will have less influence on the behavior of the magnetic stripes. Statistical correlation between positions of mutually attractive north (N) and south (S) magnetic domain walls will tend to preserve antiparallelism of neighboring magnetic stripe regions by way of magnetic flux paths in and between magnetic stripes 12 and 13 shown in FIG. 5 by arrows 96 through 101. Also, the magnetostatic coupling between magnetic stripes depends on the spacing between the magnetic stripes. The magnetic stripes will however be spaced to prevent exchange coupling.

Figure 6:
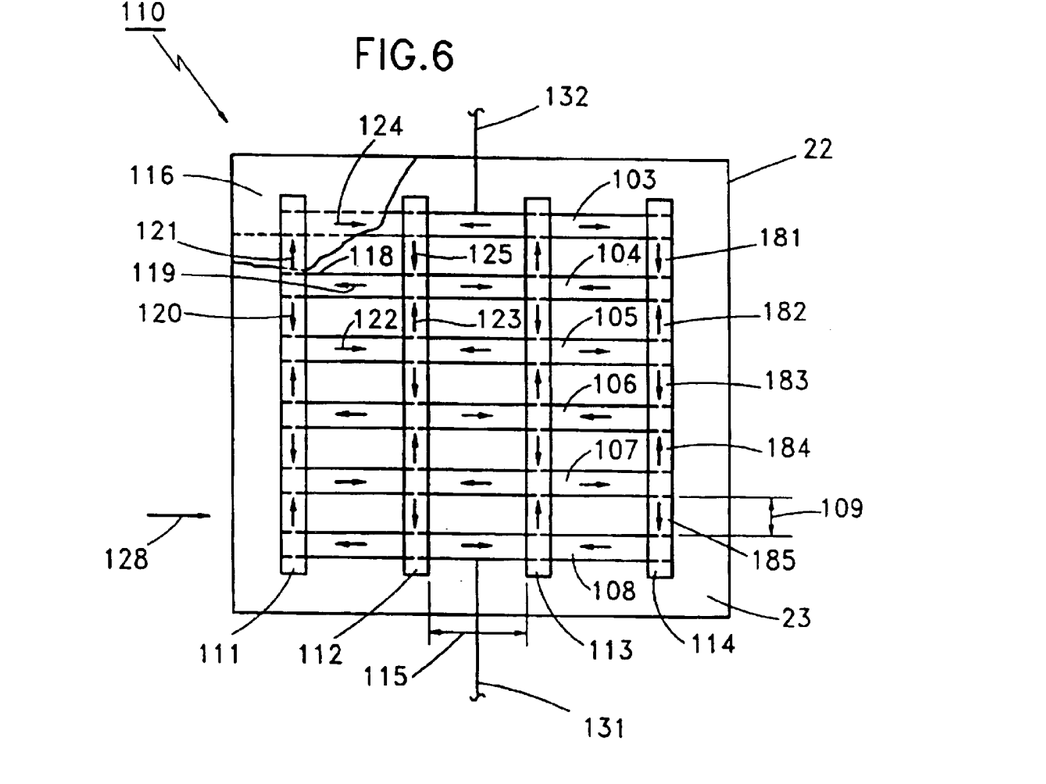
FIG. 6 is a top view of a third embodiment of the invention.

Referring to FIG. 6, a magnetic array 110 of magnetic stripes 103 through 108 is shown spaced apart on surface 23 of substrate 22 which are generally parallel to one another. Magnetic stripes 103 through 108 may be spaced apart by a first distance shown by arrow 109. Magnetic stripes 111 through 114 are shown spaced apart, generally parallel to one another and transverse to and over lapping magnetic stripes 103 to 108. Magnetic stripes 111 through 114 may have a spacing from one another shown by arrow 115. Non magnetic stripes 181 through 185 fill the space between magnetic stripes 103 and 108 to provide an electrical current path through magnetic stripes 103 through 108. Crossed or over lapping magnetic stripes 111 through 114 function as permeable keepers as permeable keepers 82 and 83 in FIG. 4.

For optimal performance, a nonmagnetic electrically insulating spacer 116 must separate magnetoresistive stripes 103-108, together with the intervening non-magnetic stripes 181–185, from magnetic stripes 111–114 which function the same as keepers 82 and 83 in FIG. 3.

The magnetic stripes 103 through 108 have segments between intersections or cross stripes 111 through 114 to provide independent flux paths some as shown in FIG. 4. For example magnetic stripe segment 118 of magnetic stripe 104 has a flux path similar as shown for magnetic stripe 13 in FIG. 4. The magnetic flux shown by arrow 119 divides at cross magnetic stripe 111 with about one half of the magnetic flux going down shown by arrow 120 and one half of the magnetic flux going up shown by arrow 121. The path of flux 120 follows magnetic stripe 105 and crossed magnetic stripe 112 shown by arrows 122 and 123. The path of flux 121 is over magnetic stripe 103 and crossed magnetic stripe 112 shown by arrows 124 and 125. The flux paths are formed by the magnetostatic coupling between cross magnetic stripes 111 and 112 to magnetic stripes 103 and 104 where they cross over. A magnetic field H may be applied in the plane of magnetic stripes 103 through 108 as shown by arrow 128 which will cause the magnetic field within magnetic stripes 103 through 108 to be aligned parallel and thus have lower resistance with respect to current passing through the array.

In one electrical arrangement for detecting the change in resistance across magnetic array 110 would be to have cross magnetic stripes 111 through 114 insulated from magnetic stripe 103 to 108 and to have conductive nonmagnetic material 181 through 185 between stripes 103 through 108 as shown in FIG. 6. The outside current could be applied by way of leads 131 and 132 across magnetic array 110. When the magnetization in magnetic stripe 103 through 108 are aligned parallel, the magnetic array 110 will be in its low resistance state. When the magnetization is oppositely aligned from stripe segment to stripe segment as shown in FIG. 6 by the arrows 119, 122 and 124, magnetic array 110 will be in the high resistance state.

Figure 7:
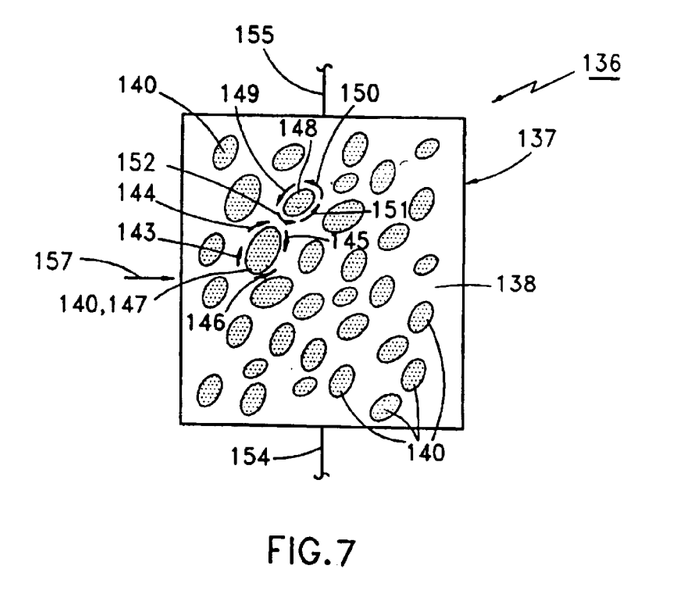
FIG. 7 is a top view of a fourth embodiment of the invention.

FIG. 7 shows a top view of magnetic device 136 for sensing a magnetic field. Device 136 consists of substrate 137 having a magnetic layer 138 formed thereover. Magnetic layer 138 has nonmagnetic regions 140 therein which may be formed by diffusing germanium or silicon into nickel, cobalt or alloys thereof which destroys the magnetic moment therein. Magnetic layer 138 is ferromagnetic. Arrows 143 through 146 show a flux path formed around nonmagnetic region 147. As is illustrate in FIG. 7 the flux path is completely contained within the magnetic layer 138 without penetrating into the nonmagnetic region 147. The magnetic flux around nonmagnetic region 148 is shown by arrows 149 through 152. Similarly, the magnetic flux around the nonmagnetic region 148 is also completely contained within the magnetic layer 138 without penetrating into the nonmagnetic region 148. Nonmagnetic regions may be sub-lithographic in dimension for example presently less than 350 nm. Nonmagnetic region 140 may be produced by bombarding a nickel-cobalt alloy layer having a film of germanium thereover with 100 KV Ge ions.

In operation of magnetic device 136 shown in FIG. 7, electrical current may be applied to magnetic layer 138 by way of leads 154 and 155. When substantially no magnetic field H is applied, the magnetic flux paths around nonmagnetic region 140 will cause device 136 to be in the high resistance state. When a magnetic field H is applied to magnetic layer 138 as shown by arrow 157, the applied magnetic field will cause the magnetization of magnetic layer 138 including magnetic flux paths around nonmagnetic region 140 to be aligned parallel with arrow 157. Magnetic device 136 will be in a low resistance state when the magnetization of layer 138 is saturated in a common direction such as in the direction of arrow 157.

Figure 8:
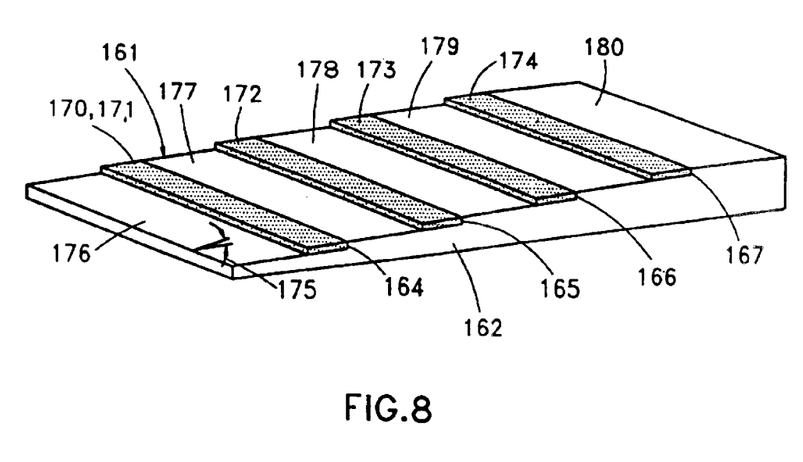
FIG. 8 is a perspective view of a fifth embodiment of the invention.

Referring to FIG. 8, one method of making a magnetic head will be described. A blanket coating of nickel, iron or cobalt or combinations thereof are deposited on an insulating substrate. The magnetic stripes are defined by lift-off or subtractive lithography. Electron beam or x-ray lithography will be required to obtain spacing between magnetic stripes, of the order of 100 Å. The magnetic stripes are then overcoated with a high sputtering yield nonmagnetic metal, for example, copper. The structure is then planarized by sputter etching or removing nonmagnetic metal on top of the magnetic stripes. The sputter etching can be done for example with glancing angle ion beam sputtering.

While it is possible to make the magnetic stripes by lithography, the resulting device would be larger than the minimum lithographic feature size. Another approach for making magnetic head 10 shown in FIG. 1 is to use structural features which provide magnetic structures of the appropriate size directly as a result of the deposition process. For example, as shown in FIG. 8, a vicinal face of a single crystal substrate is used as a seed layer. Semiconductors such as Si, Ge or GaAs are suitable substrates for the growth of Fe, Ni or Co and their alloys. The vicinal face 161 may be formed by cutting and polishing a single crystal substrate at an angle between 1 to 10° away from a major crystallographic plane and then annealing the crystal substrate 162 to produce atomic scale steps 164 through 167 and surfaces 176–180 forming vicinal face 161. The separation between interplanar steps is determined by the angle of misalignment of vicinal face 161 from a low Miller index plane shown by arrow 175. Subsequently, magnetic material 170 is deposited under conditions of for example a pressure of $10^{-8}$ Torr or less and a substrate temperature of at least 100° C. so it only grows at the step. In the early stages of growth, the magnetic material 170 grows as isolated particles along the steps 164 through 167. At a later stage, the particles begin to coalesce in a direction parallel to steps 164 through 167 but have a greater distance perpendicular or transverse to steps 164 through 167. Magnetic material 170 may be ferromagnetic material, for example, Fe, Co, or Ni or alloys thereof. Substrate 162 may be held at ambient temperature or higher. In this way, an array of parallel magnetic stripes 171 through 174 can be made which is much smaller than the minimum lithographic feature size. Magnetic stripes 171 through 174 are overcoated with a nonmagnetic metal of comparable thickness such as copper. The upper surface of the nonmagnetic metal is planarized so that there are alternating regions of magnetic and nonmagnetic metals on the vicinal face 161. Magnetic keepers can be deposited through masks generated by conventional lithography at the end of magnetic stripes 171 through 174. The magnetic keepers should have a lower spontaneous magnetization and/or thickness so that the total magnetic flux carried by the magnetic keeper is approximately one half the flux carried by the respective magnetic stripes 171 through 174 even though the magnetic stripes may have a very different cross sectional area.

A magnetic head has been described transverse to the long axis of the magnetic stripe and a means for measuring the electrical resistance of the current flowing through the plurality of magnetic stripes upon the application of the magnetic field which may be 30 Oe or less to the magnetic stripe.

Further, a method for fabricating a magnetic head has been described comprising the steps of orienting, cutting and polishing or selecting a single crystal substrate having a surface at an angle between 1 and 10° away from a major crystallographic plane, annealing the crystal to produce atomic scale steps on its surface, depositing a ferromagnetic metal such as Fe, Co, or Ni or alloys thereof onto the single crystal substrate surface with the substrate held at ambient temperature or higher, overcoating the ferromagnetic metal with a nonmagnetic metal of comparable thickness and planarizing the nonmagnetic metal to form alternating regions of magnetic and nonmagnetic metals on the surface of the substrate.

While there has been described and illustrated a magnetic head for sensing a magnetic field by the giant magnetoresistive effect (GMR), it would be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. An apparatus for sensing a magnetic field by the giant magnetoresistive effect comprising:

a substrate;

a layer of ferromagnetic material formed over the substrate, the layer of ferromagnetic material having a plurality of nonmagnetic regions formed therein whereby magnetic flux paths form around each one of the plurality of nonmagnetic regions when the layer of ferromagnetic material is not in a magnetic field, the flux paths being contained completely within the layer of ferromagnetic material and not penetrating into the plurality of nonmagnetic regions, and means for detecting a change in resistance through the layer of ferromagnetic material as a function of a magnetic field applied to the layer of ferromagnetic material.

2. The apparatus of claim 1 wherein each of the plurality of nonmagnetic regions has dimensions less than about 350 nm.

3. The apparatus of claim 1 wherein:

the layer of ferromagnetic material is formed from nickel, cobalt or alloys thereof, and the plurality of nonmagnetic regions is formed by diffusing germanium or silicon into the layer of ferromagnetic material.

4. The apparatus of claim 3 wherein the plurality of nonmagnetic regions is formed employing an ion implantation method.

* * * * *